(12) United States Patent
Chen et al.

(10) Patent No.: US 10,412,850 B1
(45) Date of Patent: Sep. 10, 2019

(54) ENGAGING MECHANISM AND RELATED SERVER DEVICE

(71) Applicant: Wistron Corporation, New Taipei (TW)

(72) Inventors: Ming-Tze Chen, New Taipei (TW); Hao-Cheng Ku, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/039,323

(22) Filed: Jul. 18, 2018

(30) Foreign Application Priority Data

Mar. 13, 2018 (TW) .............................. 107203226 U (51) Int. Cl.
*H05K 7/14* (2006.01)
(52) U.S. Cl.
CPC ......... *H05K 7/1487* (2013.01); *H05K 7/1401* (2013.01)
(58) Field of Classification Search
CPC combination set(s) only.
See application file for complete search history.

(56) References Cited

U.S. PATENT DOCUMENTS 6,208,523 B1 * 3/2001 Bertolami ............... G06F 1/183
211/41.17

FOREIGN PATENT DOCUMENTS

TW     I604775     11/2017

* cited by examiner

*Primary Examiner* — Lisa Lea-Edmonds
(74) *Attorney, Agent, or Firm* — Winston Hsu (57) ABSTRACT

An engaging mechanism with multifunctional assembling function is applied to a server device. The engaging mechanism includes a base, a latching component and an actuating component. The latching component includes a hooking portion disposed between a first end and a second end of the latching component. The actuating component is slidably disposed on the base, and includes a substrate, a pressing portion and a contacting portion. The pressing portion and the contacting portion are disposed on the substrate. When the pressing portion is in a protruding position, the contacting portion presses the second end of the latching component to set the hooking portion in an unlocked position; while the pressing portion is moved to a hiding position, the contacting portion may be separated from the second end to move the hooking portion to a locked position.

20 Claims, 10 Drawing Sheets

ENGAGING MECHANISM AND RELATED SERVER DEVICE

BACKGROUND OF THE INVENTION

1. Field of the Invention

The present disclosure relates to an engaging mechanism and a related server device, and more particularly, to an engaging mechanism with a multifunctional assembling function and a related server device.

2. Description of the Prior Art

Figure 1:
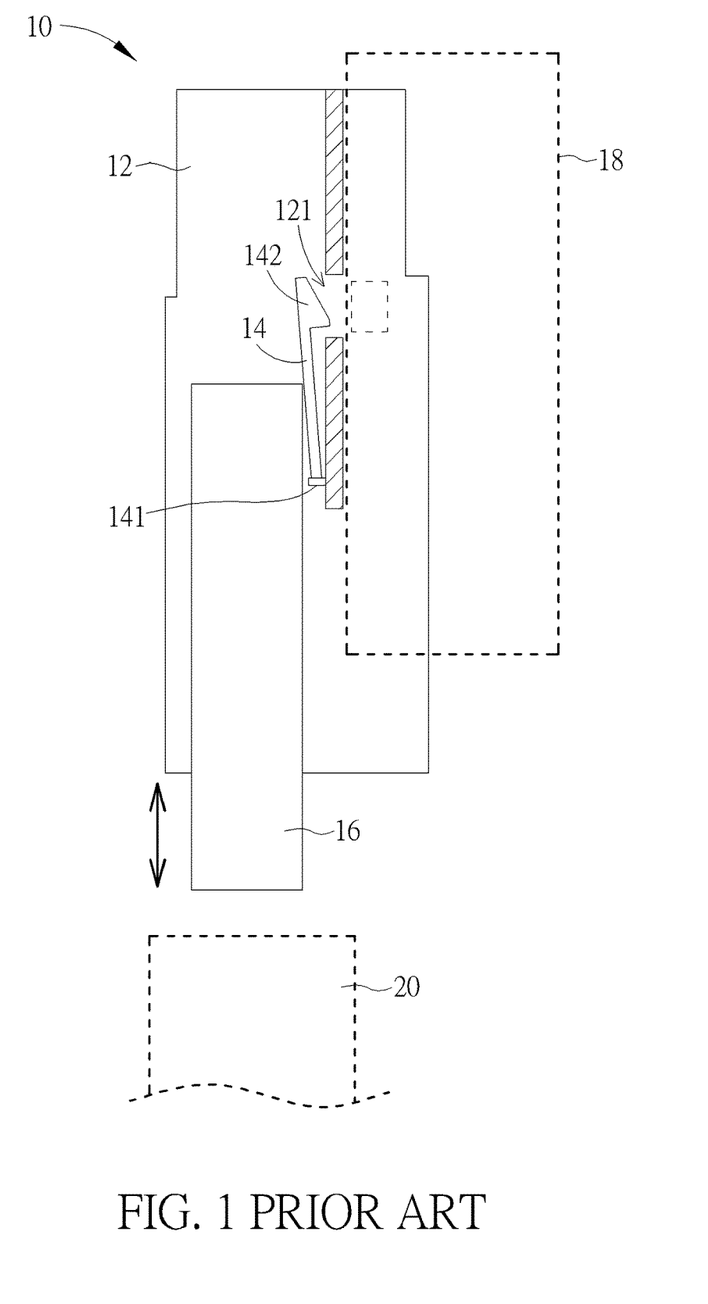
FIG. 1 is a diagram of an engaging mechanism in the prior art.

Please refer to FIG. 1. FIG. 1 is a diagram of an engaging mechanism 10 in the prior art. The engaging mechanism 10 includes a base 12, a hooking component 14 and an actuating component 16. A first end 141 of the hooking component 14 is connected to the base 12, and a second end 142 of the hooking component 14 is a free end capable of passing through a hole 121 on the base 12. The actuating component 16 is slidably disposed on the base 12. When the actuating component 16 protrudes from the base 12, the second end 142 is positioned inside the hole 121; when the actuating component 16 inserts into the base 12, the hooking component 14 is resiliently deformed to move the second end 142 out of the hole 121. Once the actuating component 16 is removed from the base 12, a resilient recovering force of the hooking component 14 can move the second end 142 into the hole 121. An operation procedure of the conventional engaging mechanism 10 is positioning the first electronic device 18 for a start, and then inserting the second electronic device 20 to push the actuating component 16 into the base 12. The second end 142 can be protruded from the hole 121 to engage with the first electronic device 18 by insertion of the actuating component 16, so that the first electronic device 18 and the second electronic device 20 can be constrained accordingly. If the second electronic device 20 is installed before the first electronic device 18, the second end 142 of the hooking component 14 is protruded from the hole 121 by the actuating component 16 inside the base 12, and the first electronic device 18 cannot be positioned due to structural interference. The conventional engaging mechanism 10 has to be operated in specific order for assembling the first electronic device 18 and the second electronic device 20.

SUMMARY OF THE INVENTION

According to the claimed disclosure, an engaging mechanism includes a base, a latching component and an actuating component. The latching component has a hooking portion. The actuating component is slidably disposed on the base. The actuating component is configured to press and resiliently deform the latching component for moving the hooking portion into the base in response to a first mode, and further to space from the latching component for removing an external force applied to the latching component in response to a second mode.

According to the claimed disclosure, the latching component includes a first end and a second end opposite to each other, the first end is disposed on the base, and the hooking portion is positioned between the first end and the second end.

According to the claimed disclosure, the actuating component includes a substrate, a pressing portion and a contacting portion. The pressing portion is disposed on the substrate. The contacting portion is disposed on the substrate and spaced from the pressing portion through an accommodating space. When the actuating component is set in the first mode, the pressing portion is moved to a protruding position and the contacting portion contacts and moves the second end of the latching component into the accommodating space for positioning the hooking portion at an unlocking position; when the actuating component is set in the second mode, the pressing portion is moved from the protruding position to a retracting position and the contacting portion is separated from or slightly touches the second end for recovering the hooking portion from the unlocking position to a locking position.

According to the claimed disclosure, the engaging mechanism further includes a covering component disposed on the base to cover the latching component and the actuating component.

According to the claimed disclosure, the first end of the latching component is disposed on the base via the covering component.

According to the claimed disclosure, the covering component includes a hole structure piercing through an inner wall and an outer wall of the covering component. The hooking portion passes through the hole structure from the inner wall to the outer wall and stays in a locking position, and is further retracted into the hole structure from the outer wall to the inner wall and stays in an unlocking position.

According to the claimed disclosure, the engaging mechanism further includes a resilient component disposed between the base and the actuating component. A resilient recovering force of the resilient component moves the actuating component from the retracting position to the protruding position.

According to the claimed disclosure, an end of the resilient component is connected to the actuating component, and the other end of the resilient component is connected to the base via the covering component.

According to the claimed disclosure, the second end of the latching component is bent from the first end to obliquely contact against the contacting portion.

According to the claimed disclosure, the hooking portion includes an inclined guiding surface and a blocking surface connected with each other. The inclined guiding surface is pressed to move the hooking portion from the locking position to the unlocking position when the pressing portion is positioned in the retracting position and the hooking portion is positioned in the locking position.

According to the claimed disclosure, a server device with engaging function includes a casing, a first electronic unit, a second electronic unit and an engaging mechanism. The first electronic unit is detachably disposed inside the casing. The second electronic unit is detachably disposed inside the casing and positioned in a way different from the first electronic unit. The engaging mechanism is disposed inside the casing. The engaging mechanism includes a base, a latching component and an actuating component. The latching component has a hooking portion. The actuating component is slidably disposed on the base. The actuating component is configured to press and resiliently deform the latching component for moving the hooking portion into the base in response to a first mode, and further to space from the latching component for removing an external force applied to the latching component in response to a second mode. The actuating component includes a substrate, a pressing portion and a contacting portion. The pressing portion is disposed on the substrate. The contacting portion is disposed on the substrate and spaced from the pressing portion through an accommodating space. When the actuating component is set in the first mode, the pressing portion is moved to a protruding position and the contacting portion contacts and moves the second end of the latching component into the accommodating space for positioning the hooking portion at an unlocking position; when the actuating component is set in the second mode, the pressing portion is moved from the protruding position to a retracting position and the contacting portion is separated from or slightly touches the second end for recovering the hooking portion from the unlocking position to a locking position.

These and other objectives of the present disclosure will no doubt become obvious to those of ordinary skill in the art after reading the following detailed description of the preferred embodiment that is illustrated in the various figures and drawings.

DETAILED DESCRIPTION

Figure 2:
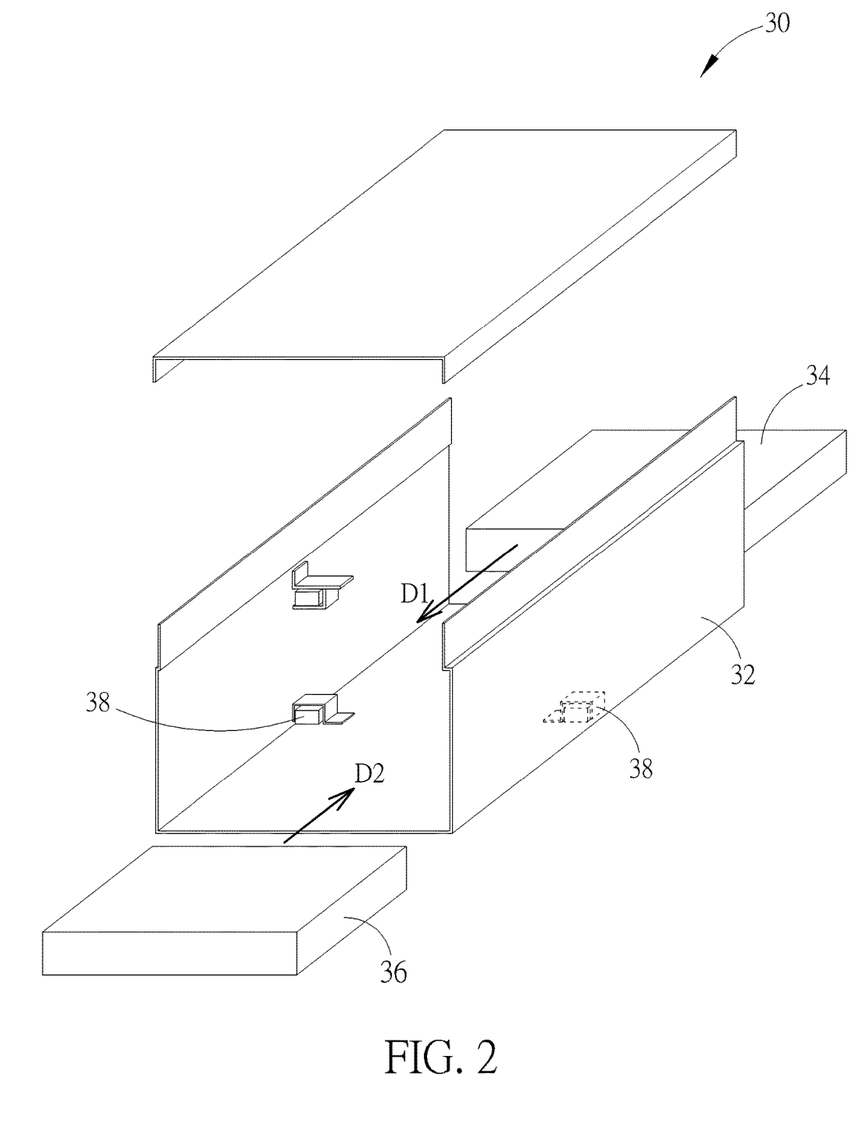
FIG. 2 is an exploded diagram of a server device according to an embodiment of the present disclosure.
Figure 3:
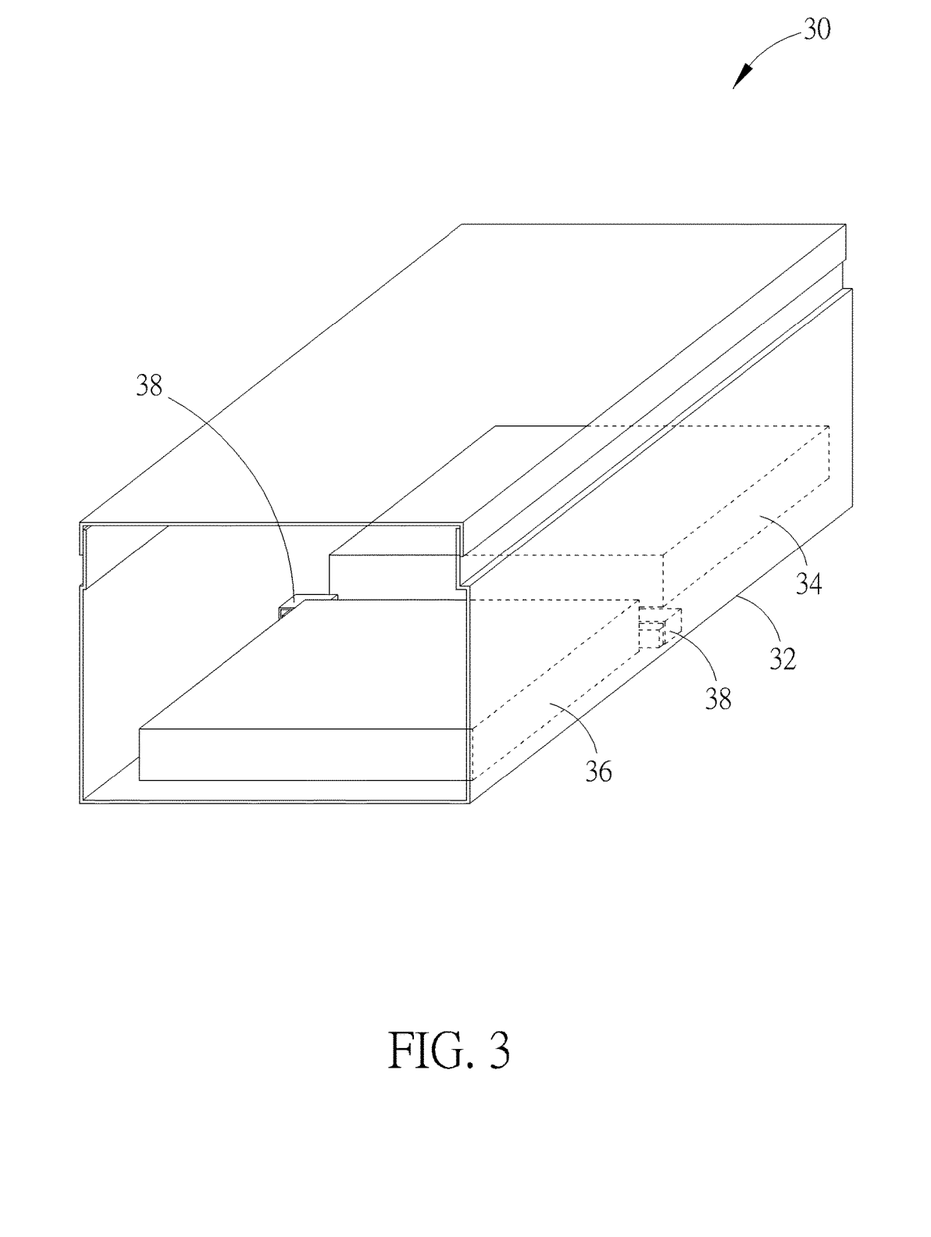
FIG. 3 is an assembly diagram of the server device according to the embodiment of the present disclosure.

Please refer to FIG. 2 and FIG. 3. FIG. 2 is an exploded diagram of a server device 30 according to an embodiment of the present disclosure. FIG. 3 is an assembly diagram of the server device 30 according to the embodiment of the present disclosure. The server device 30 can include a casing 32, a first electronic unit 34, a second electronic unit 36 and an engaging mechanism 38. The first electronic unit 34 and the second electronic unit 36 can be disposed on different positions inside the casing 32 in a detachable manner, and are constrained by the engaging mechanism 38. The first electronic unit 34 can be installed into the casing 32 in a first direction D1, and the second electronic unit 36 can be moved close to or installed into the casing 32 in a second direction D2 for actuating the engaging mechanism 38. The engaging mechanism 38 having a multifunctional assembling function is disposed inside the casing 32, and a user can optionally install any of the first electronic unit 34 and the second electronic unit 36 into the casing 32, and then the other electronic unit is installed accordingly. An operation method of the engaging mechanism 38 is not limited to assembly order of the first electronic unit 34 and the second electronic unit 36.

Figure 4:
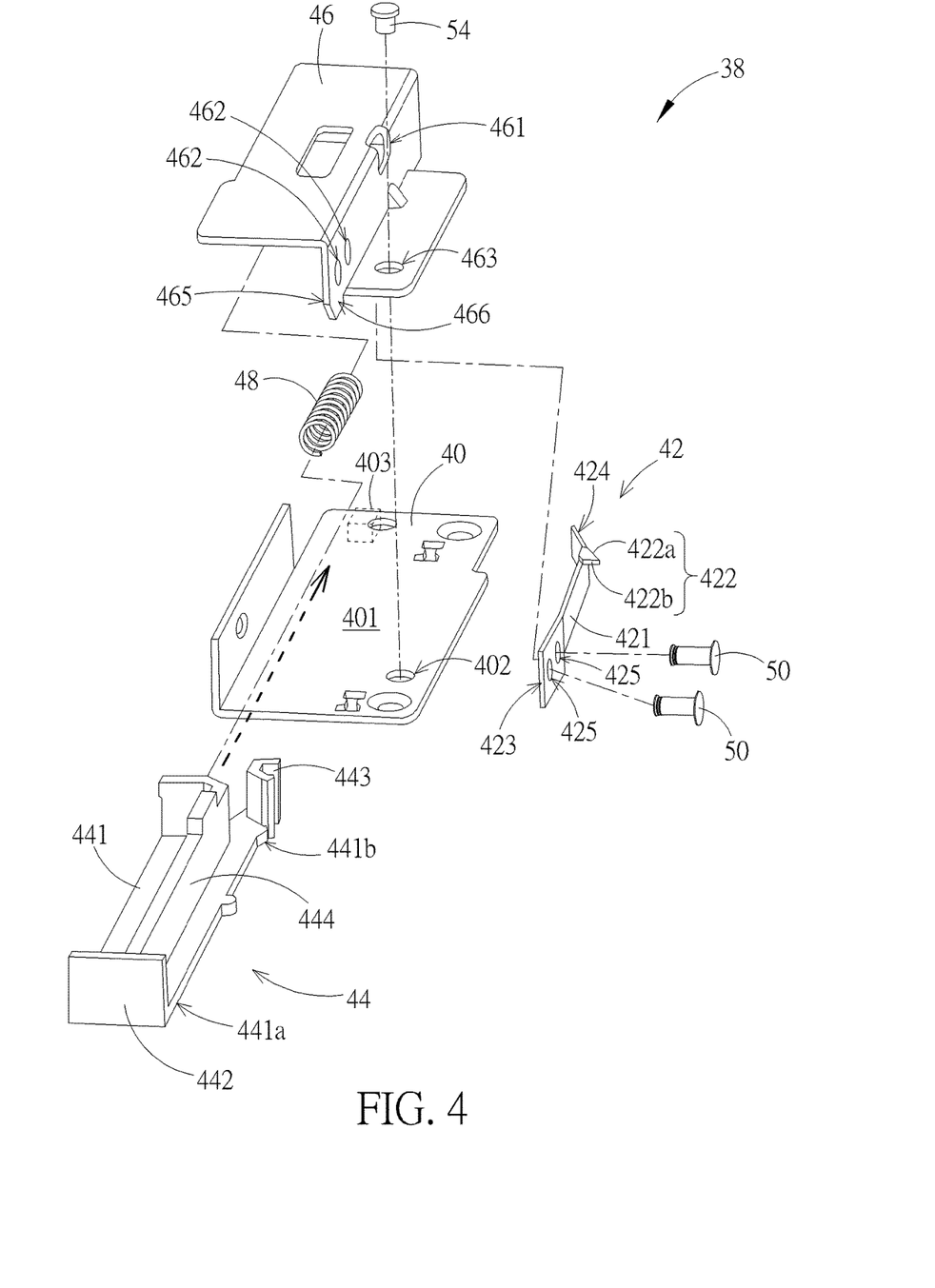
FIG. 4 is an exploded diagram of an engaging mechanism according to the embodiment of the present disclosure.
Figure 5:
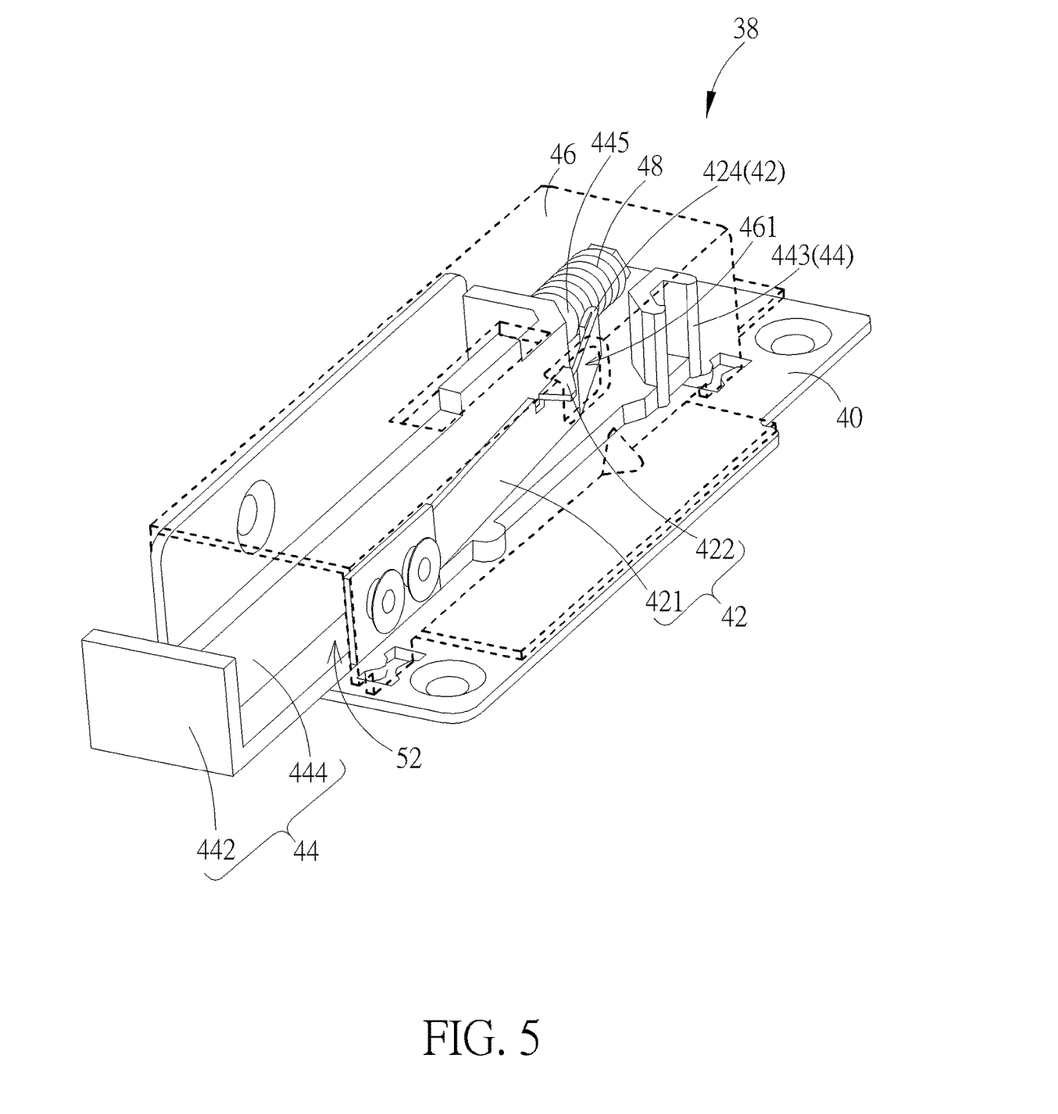
FIG. 5 is an assembly diagram of the engaging mechanism according to the embodiment of the present disclosure.

Please refer to FIG. 4 to FIG. 10. FIG. 4 is an exploded diagram of the engaging mechanism 38 according to the embodiment of the present disclosure. FIG. 5 is an assembly diagram of the engaging mechanism 38 according to the embodiment of the present disclosure. FIG. 6 to FIG. 10 respectively are diagrams of the engaging mechanism 38 in different modes according to the embodiment of the present disclosure. The engaging mechanism 38 can include a base 40, a latching component 42, an actuating component 44, a covering component 46 and a resilient component 48. The latching component 42 can be directly disposed on the base 40, or can be indirectly disposed on the base 40 via the covering component 46. The latching component 42 can include a plate-typed main body 421 and a hooking portion 422. The hooking portion 422 is disposed between a first end 423 and a second end 424 of the main body 421, and the first end 423 is opposite to the second end 424. The first end 423 of the latching component 42 can be fixed on the base 40 or the covering component 46, and the second end 424 can be a free end. For example, the engaging mechanism 38 may have a fixing component 50 passing through a locking hole 425 on the latching component 42 and a locking hole 462 on the covering component 46, so as to fix the first end 423 onto the covering component 46. The fixing component 50 can be a rivet, a screw or a bolt. In case of fixing the latching component 42 onto the base 40, the first end 423 and a surface 401 of the base 40 can be welded, or the first end 423 can be inserted into a slot (not shown in the figures) formed on the surface 401. The hooking portion 422 can be swayed freely via resilient deformation property of the main body 421.

The actuating component 44 can be disposed on the base 40 in a slidable manner. The actuating component 44 can include a substrate 441, a pressing portion 442, a contacting portion 443 and a rib portion 444. Generally, the pressing portion 442 and the contacting portion 443 are disposed on two opposite positions of the substrate 441, which means the pressing portion 442 can be positioned on a first edge 441a of the substrate 441 and the contacting portion 443 can be positioned on a second edge 441b of the substrate 441. As the second edge 441b is located inside the base 40, the first edge 441a can protrude from the base 40 and the user can conveniently push or pull the actuating component 44 via the pressing portion 442 to switch modes of the engaging mechanism 38. The pressing portion 442 is spaced from the contacting portion 443, which means the pressing portion 442 is not connected to the contacting portion 443. The rib portion 444 is an optional element disposed on the substrate 441 and connected to the pressing portion 442 for increasing structural strength of the actuating component 44. For example, the pressing portion 442 may be easily deformed relative to the substrate 441 by pressure when the actuating component 44 does not have the rib portion 444; as the rib portion 444 is included, the rib portion 444 can support the pressing portion 442 to prevent accidental deformation. The rib portion 444 is connected to the pressing portion 442, so that an accommodating space 52 can be formed among the pressing portion 442, the contacting portion 443, the rib portion 444 and the covering component 46. The accommodating space 52 is sufficient for deformation of the latching component 42.

The covering component 46 can be disposed on the base 40 to cover the latching component 42, the actuating component 44 and the resilient component 48 for dust-proof and press-proof functions. The covering component 46 and the latching component 42 can be locked on the base 40 via some locking component 54, such as the rivet, the screw and the bolt. For example, the locking component 54 can pass through a locking hole 463 formed on the covering component 46 to be engaged with a locking hole 402 formed on the base 40; however, the component 46 may be fixed onto the base 40 via other possible engagement. The hooking portion 422 can protrude from a hole structure 461 on the covering component 46 or be retracted into the hole structure 461 at different steps during resilient deformation of the latching component 42. As shown in FIG. 4, the covering component 46 has an inner wall 465 and an outer wall 466. The hooking portion 422 passing through the hole structure 461 indicates that the hooking portion 422 inserts into the inner wall 465 and arrives or protrudes from the outer wall 466 for passing the hole structure 461. The hooking portion 422 being retracted into the hole structure 461 indicates that the hooking portion 422 is moved back from the outer wall 466 into the inner wall 465, and does not protrude from the outer wall 466.

In the embodiment of the present disclosure, the second end 424 of the latching component 42 is bent from the first end 423. The second end 424 can be turned inwardly to obliquely contact against the contacting portion 443 when the hooking portion 422 protrudes from the hole structure 461. The hooking portion 422 includes an inclined guiding surface 422a and a blocking surface 422b connected with each other. The inclined guiding surface 422a faces the contacting portion 443, and the blocking surface 422b faces the pressing portion 442. The resilient component 48 is disposed between the base 40 and the actuating component 44. An end of the resilient component 48 is connected to the actuating component 44; for example, the resilient component 48 can be disposed on a protrusion 445 formed on the rib portion 444 of the actuating component 44, as shown in FIG. 5 to FIG. 10. The other end of the resilient component 48 can be indirectly connected to the base 40 via the covering component 46; for example, the resilient component 48 can be can be disposed on a protrusion 464 formed on the covering component 46, as shown in FIG. 6 to FIG. 10. Besides, a blocking wall 403 can be formed on the surface 401 of the base 40, such as a cube drawn by dotted lines shown in FIG. 4. The other end of the resilient component 48 can abut upon the blocking wall 403 or be disposed on a protrusion (not shown in the figures) on the blocking wall 403.

Figure 6:
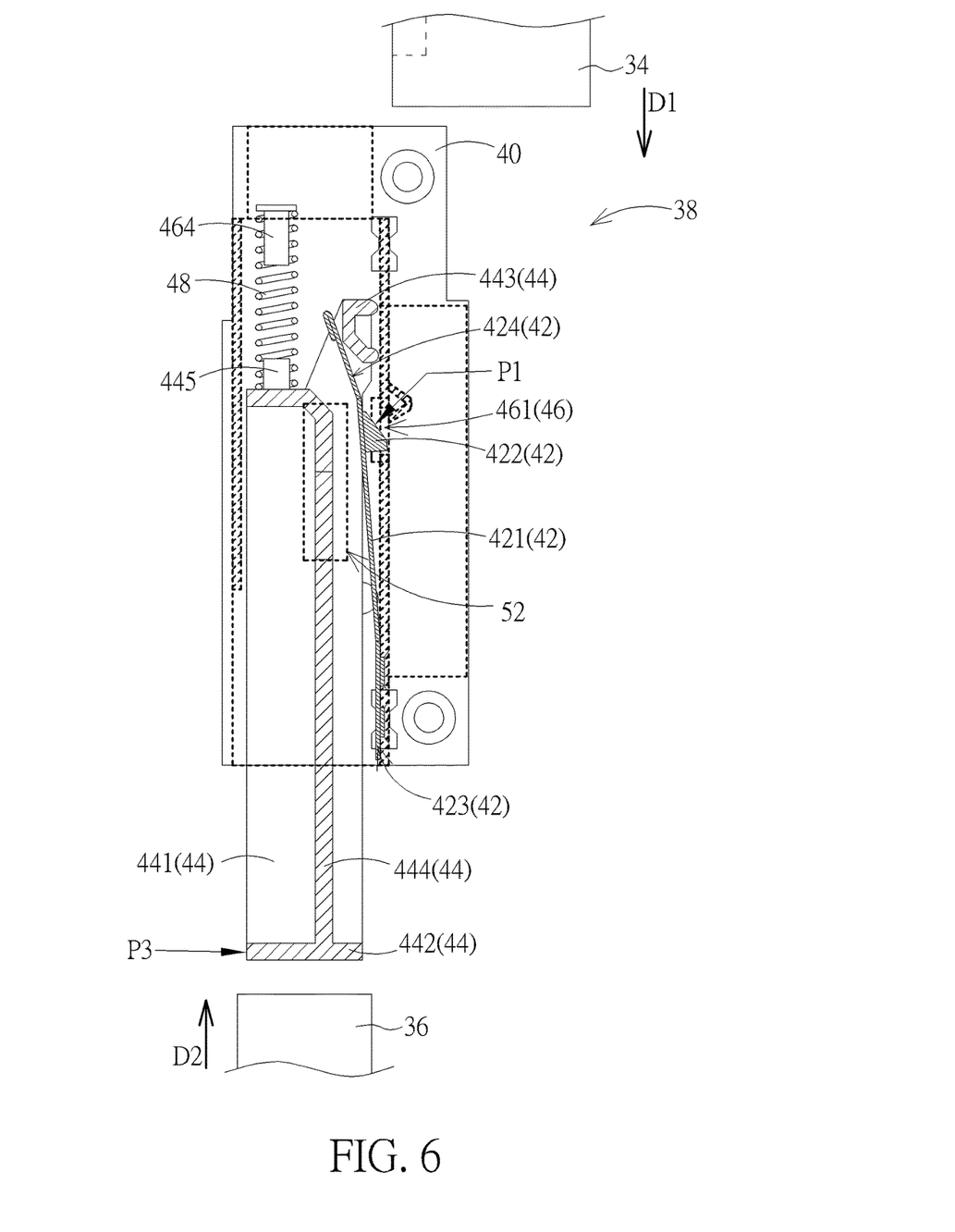
FIG. 6 to FIG. 10 respectively are diagrams of the engaging mechanism in different modes according to the embodiment of the present disclosure.

The engaging mechanism 38 shown in FIG. 6 is set in an initial mode. The actuating component 44 set in the first mode can utilize a resilient recovering force of the resilient component 48 to stay the pressing portion 442 in a protruding position P3; meanwhile, the pressing portion 442 and most of the rib portion 444 are positioned out of the base 40, and the contacting portion 443 contacts against the second end 424 of the latching component 42 to stay the second end 424 inside the accommodating space 52, therefore the main body 421 is compressed and the resilient recovering force is stored accordingly. At this time, the hooking portion 422 is positioned at the unlocking position P1, which means the hooking portion 422 does not protrude from the hole structure 461 but stays inside the accommodating space 52, that is to say, the first electronic unit 34 can be installed into the casing 32 in the first direction D1 and the second electronic unit 36 can optionally approach or enter the casing 32 in the second direction D2 when the engaging mechanism 38 is set in the initial mode.

Figure 7:
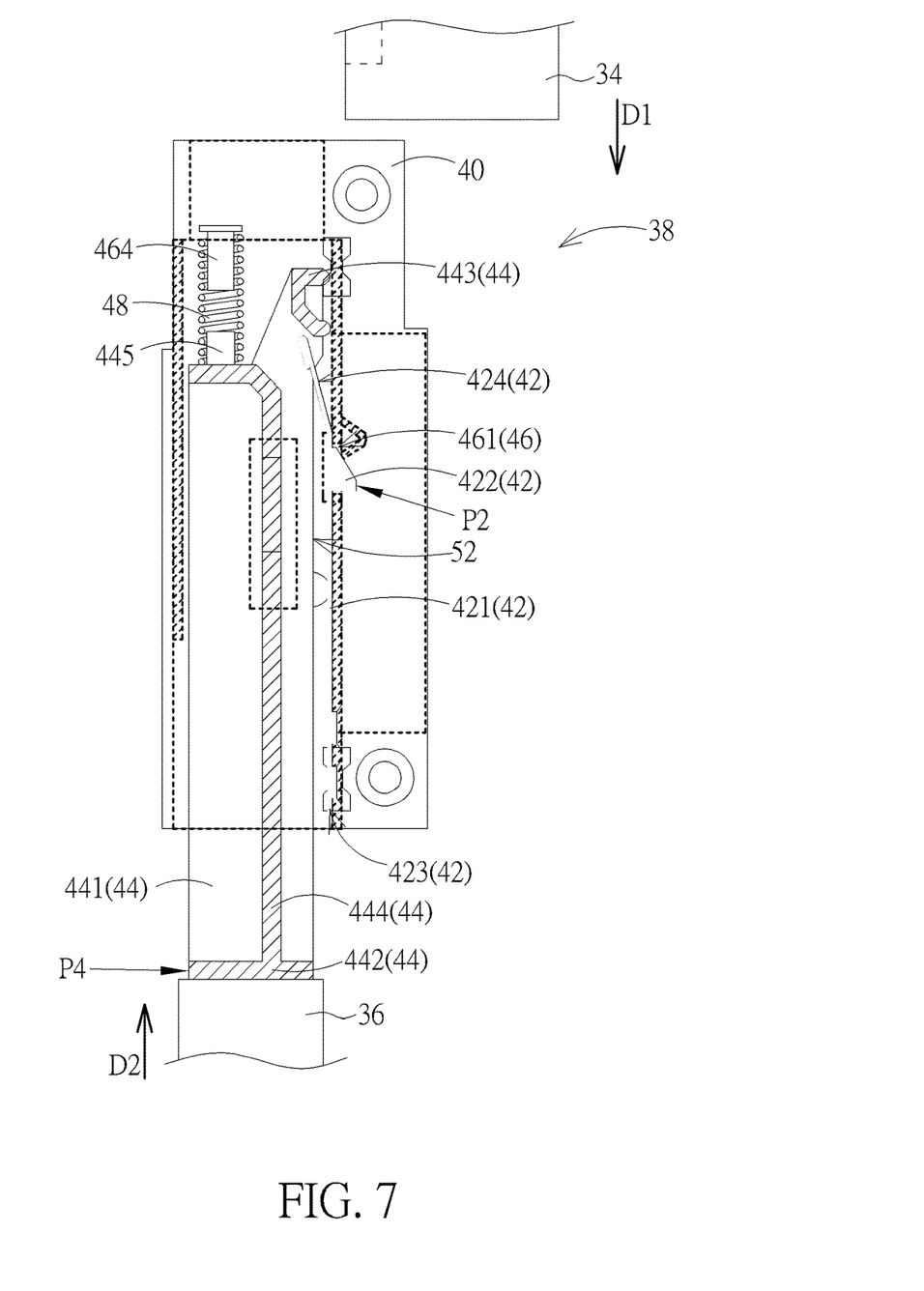
Figure 8:
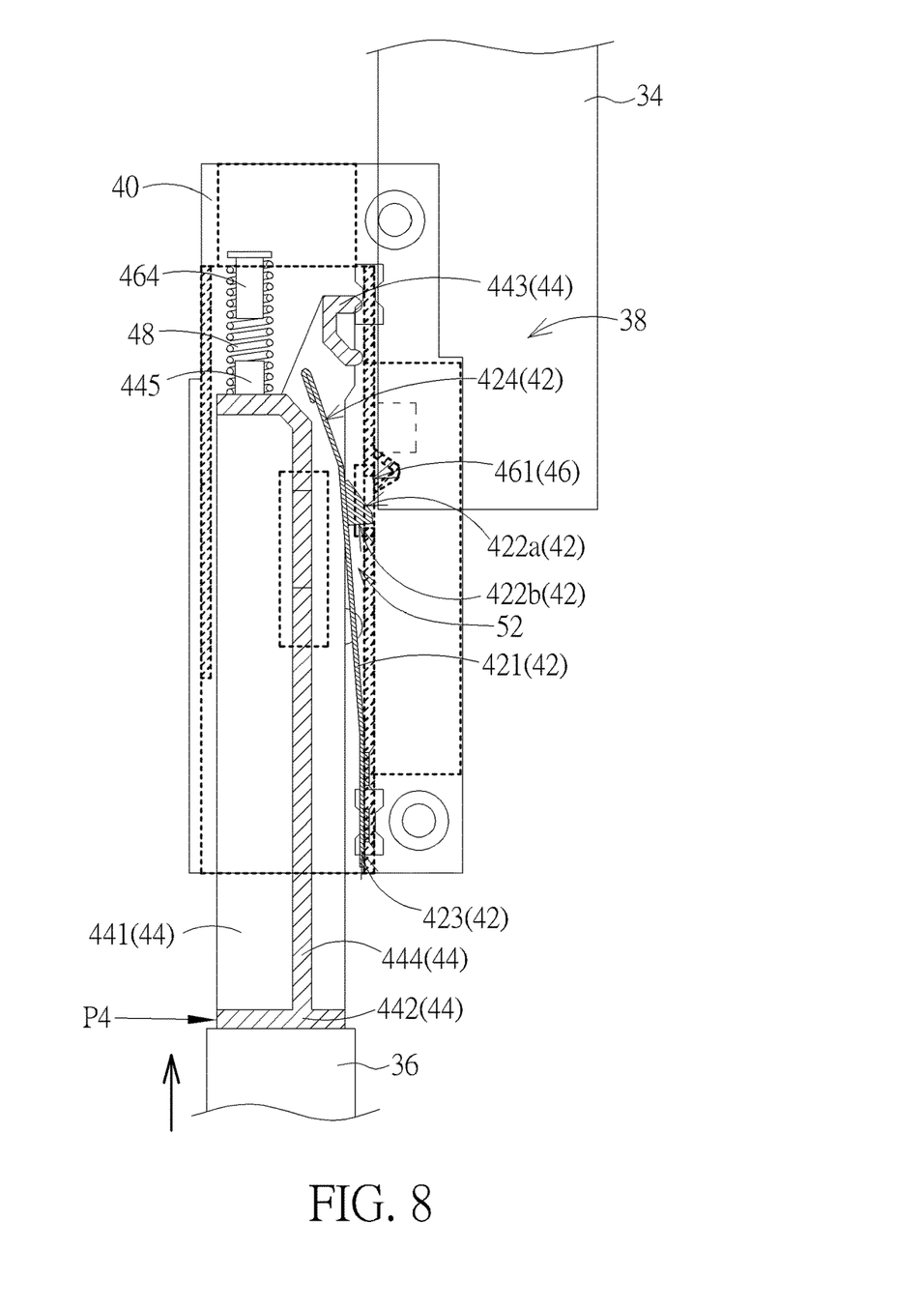

In the event of installing the second electronic unit 36 for a start, as shown in FIG. 7, the second electronic unit 36 can push the pressing portion 442 to switch the actuating component 44 into a second mode, and the pressing portion 442 is moved from the protruding position P3 to the retracting position P4; meanwhile, the pressing portion 442 is located out of the base 40 but most of the rib portion 444 is moved into the base 40, and the contacting portion 443 is moved in a direction far from the latching component 42. When the latching component 42 is not pressed by the actuating component 44, the contacting portion 443 can be spaced from or slightly touch the second end 424 of the latching component 42, and the hooking portion 422 can be automatically protruded from the hole structure 461 via the resilient recovering force of the main body 421 released, which means the hooking portion 422 located inside the accommodating space 52 can stay right above a moving path of the first electronic unit 34. The foresaid moving path is represented as the first electronic unit 34 is recovered from the unlocking position P1 to the locking position P2. The second end 424 of the latching component 42 can be resiliently deformed within the accommodating space 52 of the engaging mechanism 38 without obstruction. As shown in FIG. 8, the first electronic unit 34 is installed into the casing 32, so the first electronic unit 34 can push the inclined guiding surface 422a of the hooking portion 422 to generate resilient deformation, therefore the hooking portion 422 can be moved into the hole structure 461 and switched from the locking position P2 to the unlocking position P1. Definition about the unlocking position P1 and the locking position P2 can be referred to illustration shown in FIG. 6 and FIG. 7. When the first electronic unit 34 is positioned, the hooking portion 422 is recovered to protrude from the hole structure 461 for switching from the unlocking position P1 to the locking position P2, and the blocking surface 422b of the hooking portion 422 can insert into a corresponding hole on the first electronic unit 34 for constraint.

Figure 9:
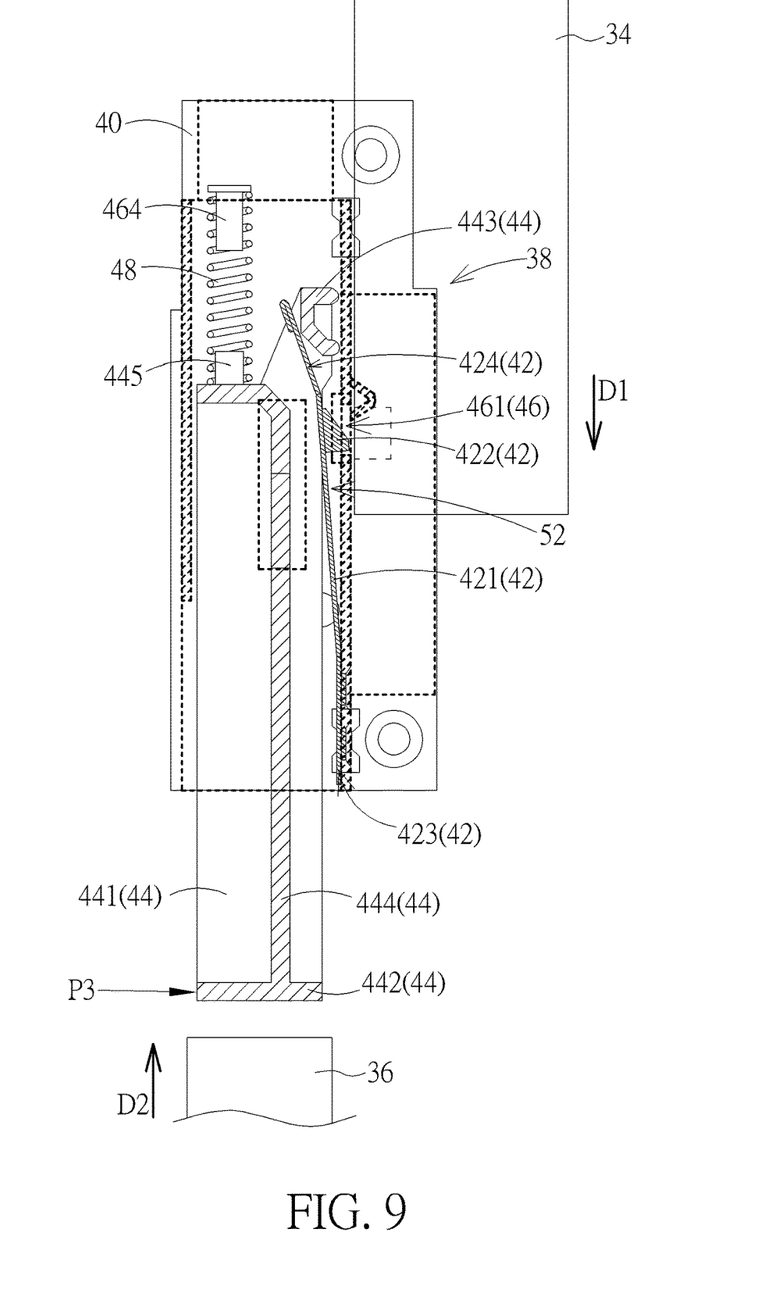
Figure 10:
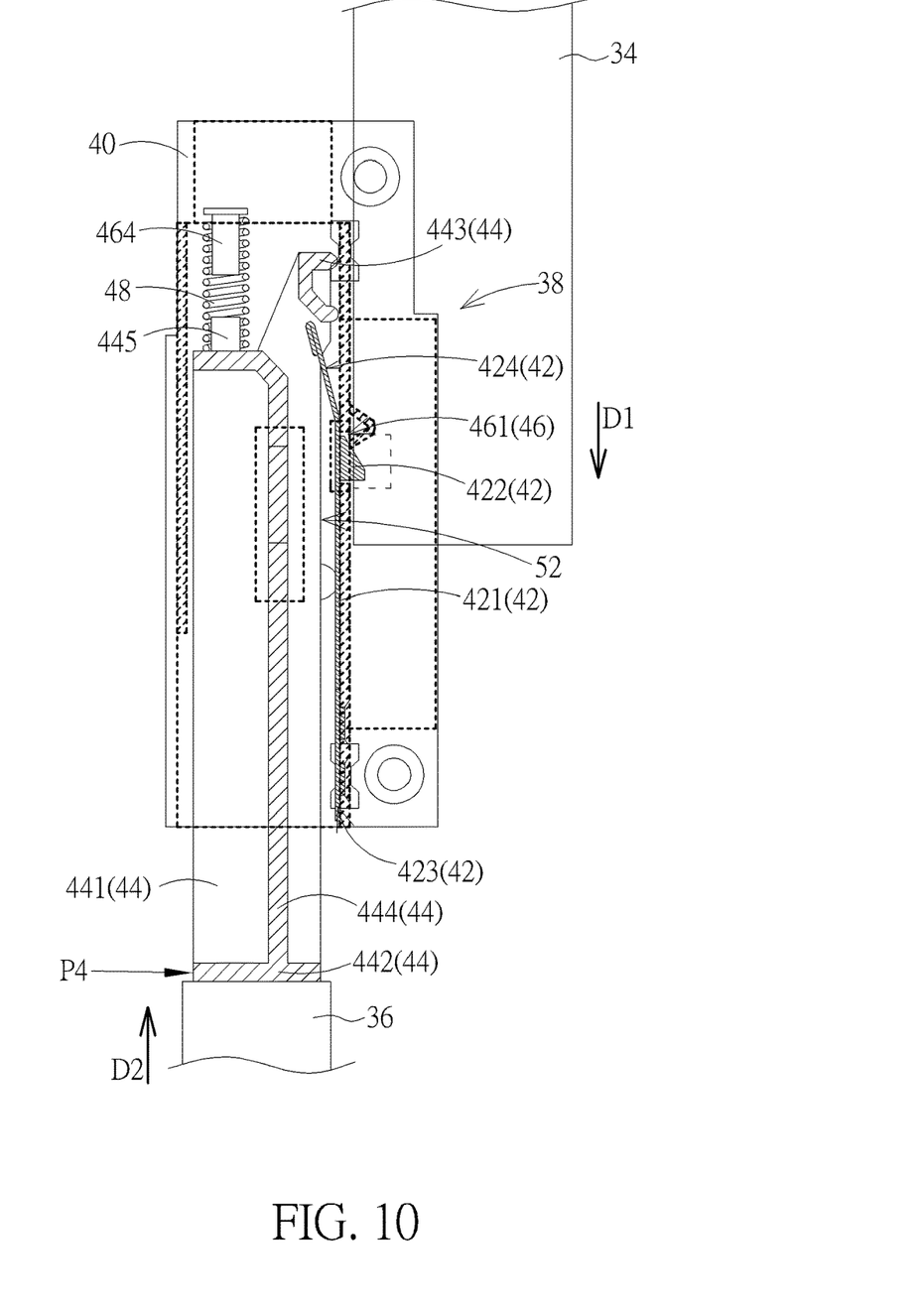

In the event of installing the first electronic unit 34 for a start, as shown in FIG. 9, the actuating component 44 is set in the first mode, and the hooking portion 422 is retracted into the hole structure 461 so the first electronic unit 34 can be freely moved into and out of the casing 32. The user can install the second electronic unit 36 after the first electronic unit 34 positioned. As shown in FIG. 10, the actuating component 44 is set in the second mode; the second electronic unit 36 can be installed into the casing 32 to push and move the actuating component 44 from the protruding position P3 to the retracting position P4, and the resilient component 48 is compressed to store the resilient recovering force. When the contacting portion 443 is spaced from or slightly touch the second end 424 of the latching component 42, the resilient recovering force of the main body 421 is released, and the hooking portion 422 can protrude from the hole structure 461 to insert into a corresponding hole on the first electronic unit 34 for constraining movements of the first electronic unit 34 and the second electronic unit 36 relative to the casing 32.

For disassembly of the first electronic unit 34 and the second electronic unit 36, when the second electronic unit 36 is pulled out of the casing 32, the resilient recovering force of the resilient component 48 is released to move the latching component 42 from the retracting position P4 (which can be shown in FIG. 7 and FIG. 8) to the protruding position P3 (which can be shown in FIG. 6). The second end 424 of the latching component 42 is pressed by the contacting portion 443 and accordingly moved into the accommodating space 52, so that the hooking portion 422 can be moved from the locking position P2 (which can be shown in FIG. 7) to the unlocking position P1 (which can be shown in FIG. 6 and FIG. 8), and then the first electronic unit 34 can be freely disassembled from the casing 32.

In conclusion, the two electronic units can be installed into the casing in random order by the engaging mechanism of the present disclosure. Any of the first electronic unit and the second electronic unit can be installed successfully no matter what assembling order is applied. An operation procedure of the conventional engaging mechanism has to install the electronic devices by specific order or else the two electronic devices cannot be assembled because of structural interference. The conventional engaging mechanism has to be operated in the specific order, which results in inconvenience. Comparing to the prior art, installation of the two electronic units is not limited to the specific order via the engaging mechanism and the related server device of the present disclosure. The user can choose any of the electronic units for the installation in accordance with an actual demand.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An engaging mechanism, comprising:
   a base;
   a latching component comprising a hooking portion; and
   an actuating component slidably disposed on the base and comprising a pressing portion and a contacting portion disposed on a substrate, an accommodating space being formed between the pressing portion and the contacting portion, the actuating component being configured to press and resiliently deform the latching component for moving the hooking portion into the accommodating space in response to a first mode, and further to space from the latching component for removing an external force applied to the latching component so as to depart the hooking portion from the accommodating space in response to a second mode.

2. The engaging mechanism of claim 1, wherein the latching component comprises a first end and a second end opposite to each other, the first end is disposed on the base, and the hooking portion is positioned between the first end and the second end.

3. The engaging mechanism of claim 2, wherein
   when the actuating component is set in the first mode, the pressing portion is moved to a protruding position and the contacting portion contacts and moves the second end of the latching component into the accommodating space for positioning the hooking portion at an unlocking position, when the actuating component is set in the second mode, the pressing portion is moved from the protruding position to a retracting position and the contacting portion is separated from or slightly touches the second end for recovering the hooking portion from the unlocking position to a locking position.

4. The engaging mechanism of claim 3, further comprising:
   a covering component disposed on the base to cover the latching component and the actuating component, and the first end of the latching component being disposed on the base via the covering component.

5. The engaging mechanism of claim 4, wherein the covering component comprises a hole structure piercing through an inner wall and an outer wall of the covering component, the hooking portion passes through the hole structure from the inner wall to the outer wall and stays in a locking position, and is further retracted into the hole structure from the outer wall to the inner wall and stays in an unlocking position.

6. The engaging mechanism of claim 4, further comprising:
   a resilient component disposed between the base and the actuating component, a resilient recovering force of the resilient component moving the actuating component from the retracting position to the protruding position.

7. The engaging mechanism of claim 6, wherein an end of the resilient component is connected to the actuating component, and the other end of the resilient component is connected to the base via the covering component.

8. The engaging mechanism of claim 3, wherein the second end of the latching component is bent from the first end to obliquely contact against the contacting portion.

9. The engaging mechanism of claim 3, wherein the actuating component further comprises a rib portion disposed on the substrate, the rib portion is connected to the pressing portion and adjacent to the contacting portion.

10. The engaging mechanism of claim 3, wherein the hooking portion comprises an inclined guiding surface and a blocking surface connected with each other, the inclined guiding surface is pressed to move the hooking portion from the locking position to the unlocking position when the pressing portion is positioned in the retracting position and the hooking portion is positioned in the locking position.

11. A server device with engaging function, comprising:
    a casing;
    a first electronic unit detachably disposed inside the casing;
    a second electronic unit detachably disposed inside the casing and positioned in a way different from the first electronic unit; and
    an engaging mechanism disposed inside the casing, the engaging mechanism comprising:
      a base;
      a latching component comprising a hooking portion; and
      an actuating component slidably disposed on the base and comprising a pressing portion and a contacting portion disposed on a substrate, an accommodating space being formed between the pressing portion and the contacting portion, the actuating component being configured to press and resiliently deform the latching component for moving the hooking portion into the accommodating space in response to a first mode, and further to space from the latching component for removing an external force applied to the latching component so as to depart the hooking portion from the accommodating space in response to a second mode.

12. The server device of claim 11, wherein the latching component comprises a first end and a second end opposite to each other, the first end is disposed on the base, and the hooking portion is positioned between the first end and the second end.

13. The server device of claim 12, wherein
    when the actuating component is set in the first mode, the pressing portion is moved to a protruding position and the contacting portion contacts and moves the second end of the latching component into the accommodating space for positioning the hooking portion at an unlocking position, when the actuating component is set in the second mode, the pressing portion is moved from the protruding position to a retracting position and the contacting portion is separated from or slightly touches the second end for recovering the hooking portion from the unlocking position to a locking position.

14. The server device of claim 13, wherein the engaging mechanism further comprises a covering component disposed on the base to cover the latching component and the actuating component, and the first end of the latching component is disposed on the base via the covering component.

15. The server device of claim 14, wherein the covering component comprises a hole structure piercing through an inner wall and an outer wall of the covering component, the hooking portion passes through the hole structure from the inner wall to the outer wall and stays in a locking position, and is further retracted into the hole structure from the outer wall to the inner wall and stays in an unlocking position.

16. The server device of claim 14, wherein the engaging mechanism further comprises a resilient component disposed between the base and the actuating component, a resilient recovering force of the resilient component moves the actuating component from the retracting position to the protruding position.

17. The server device of claim 16, wherein an end of the resilient component is connected to the actuating component, and the other end of the resilient component is connected to the base via the covering component.

18. The server device of claim 13, wherein the second end of the latching component is bent from the first end to obliquely contact against the contacting portion.

19. The server device of claim 13, wherein the actuating component further comprises a rib portion disposed on the substrate, the rib portion is connected to the pressing portion and adjacent to the contacting portion.

20. The server device of claim 13, wherein the hooking portion comprises an inclined guiding surface and a blocking surface connected with each other, the inclined guiding surface is pressed to move the hooking portion from the locking position to the unlocking position when the pressing portion is positioned in the retracting position and the hooking portion is positioned in the locking position.

* * * * *